(12) United States Patent
Yoshimura et al.

(10) Patent No.: US 10,522,355 B2
(45) Date of Patent: Dec. 31, 2019

(54) METHOD OF MANUFACTURING SEMICONDUCTOR DEVICE

(71) Applicant: FUJI ELECTRIC CO., LTD., Kawasaki-shi, Kanagawa (JP)

(72) Inventors: Takashi Yoshimura, Matsumoto (JP); Hiroshi Takishita, Matsumoto (JP); Seiichi Miyahara, Azumino (JP)

(73) Assignee: FUJI ELECTRIC CO., LTD., Kawasaki-Shi, Kanagawa (JP)

( * ) Notice: Subject to any disclaimer, the term of this patent is extended or adjusted under 35 U.S.C. 154(b) by 0 days.

(21) Appl. No.: 16/459,487

(22) Filed: Jul. 1, 2019

(65) Prior Publication Data

US 2019/0326119 A1 Oct. 24, 2019

Related U.S. Application Data

(63) Continuation of application No. PCT/JP2018/021925, filed on Jun. 7, 2018.

(30) Foreign Application Priority Data

Jul. 12, 2017 (JP) ................................ 2017-136402

(51) Int. Cl.
*H01L 21/265* (2006.01)
*H01L 21/04* (2006.01)
(Continued)

(52) U.S. Cl.
CPC .......... *H01L 21/265* (2013.01); *H01L 21/045* (2013.01); *H01L 21/046* (2013.01);
(Continued)

(58) Field of Classification Search
CPC ..... H01L 21/265; H01L 21/22; H01L 21/045; H01L 29/868; H01L 29/36; H01L 29/78; H01L 29/739; H01L 21/046
See application file for complete search history.

(56) References Cited

U.S. PATENT DOCUMENTS

2013/0065382 A1   3/2013   Nishio et al.
2013/0119432 A1   5/2013   Lu
(Continued)

FOREIGN PATENT DOCUMENTS

JP      S62299071 A    12/1987
JP      2004103841 A    4/2004
(Continued)

*Primary Examiner* — Kyoung Lee
(74) *Attorney, Agent, or Firm* — Rabin & Berdo, P.C.

(57) ABSTRACT

A resist protective film protects front surfaces of a front electrode and a polyimide protective film. With a BG tape affixed to the resist protective film, a semiconductor substrate is ground from a rear surface to a predetermined product thickness. After the BG tape is removed, a predetermined diffusion region is formed in a surface layer at the ground rear surface of the semiconductor substrate. The resist protective film is heated to and maintained at a temperature of at least 100 degrees C., for evaporating water in the resist protective film. Laser is irradiated from the rear surface of the semiconductor substrate, activating an impurity of the diffusion region. The resist protective film is removed. Thus, during heat treatment for impurity activation at one main surface of the semiconductor wafer, deterioration, peeling, and deformation of the resist protective film protecting the other main surface of the semiconductor wafer may be suppressed.

9 Claims, 12 Drawing Sheets

(51) Int. Cl.
*H01L 29/36* (2006.01)
*H01L 29/739* (2006.01)
*H01L 29/78* (2006.01)
*H01L 29/868* (2006.01)
*H01L 21/22* (2006.01)

(52) U.S. Cl.
CPC .............. *H01L 21/22* (2013.01); *H01L 29/36* (2013.01); *H01L 29/739* (2013.01); *H01L 29/78* (2013.01); *H01L 29/868* (2013.01)

(56) References Cited

U.S. PATENT DOCUMENTS

| | | |
|---|---|---|
| 2014/0291723 A1 | 10/2014 | Miyazaki et al. |
| 2015/0060938 A1 | 3/2015 | Lu |
| 2017/0025520 A1 | 1/2017 | Miyazaki et al. |
| 2017/0373141 A1 * | 12/2017 | Yoshida .............. H01L 21/8234 |

FOREIGN PATENT DOCUMENTS

| | | |
|---|---|---|
| JP | 2013058616 A | 3/2013 |
| JP | 2017011000 A | 1/2017 |
| WO | 2012056536 A1 | 5/2012 |
| WO | 2013108911 A1 | 7/2013 |
| WO | 2014041652 A1 | 3/2014 |

\* cited by examiner

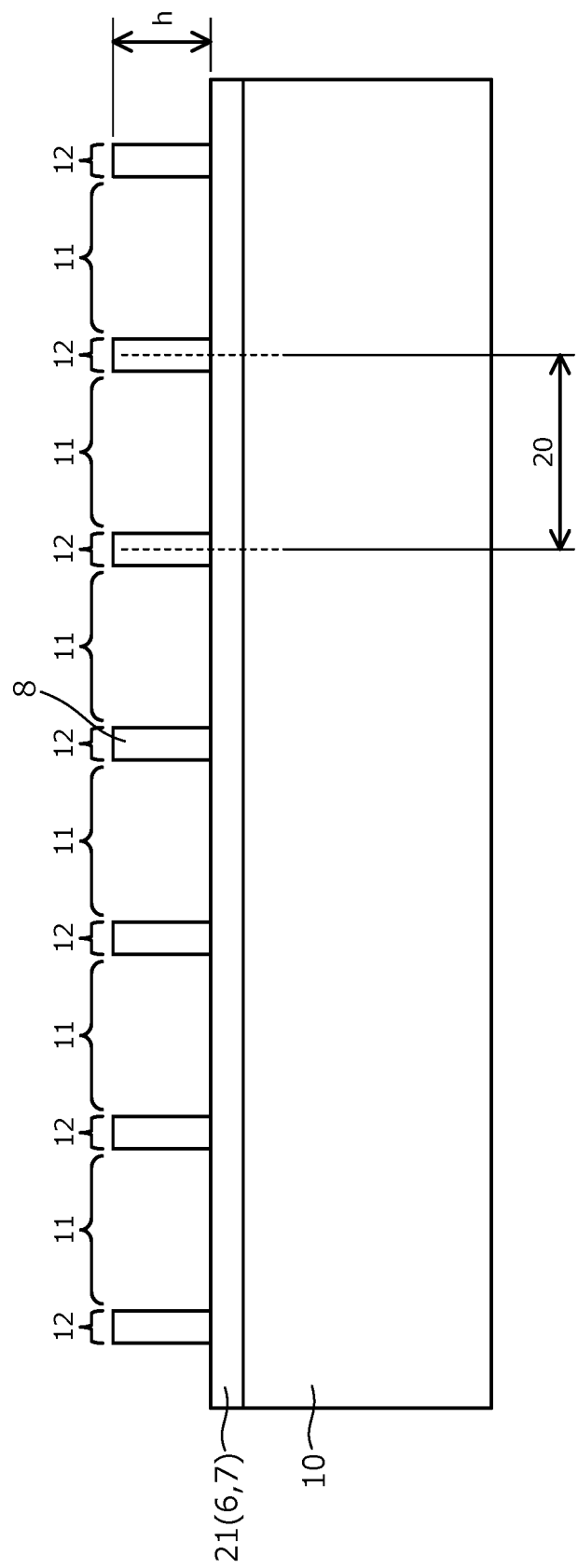

FIG.13

| WAFER THICKNESS [μm] | NO PREBAKING (FIRST CONVENTIONAL EXAMPLE) | PREBAKING (FIRST EXAMPLE) |
|---|---|---|
| 40 | × | × |
| 50 | × | ○ |
| 60 | × | ○ |
| 70 | ○ | ○ |

FIG.14

| WAFER THICKNESS [μm] | NO PREBAKING (SECOND CONVENTIONAL EXAMPLE) | PREBAKING (SECOND EXAMPLE) |
|---|---|---|
| 60 | × | × |
| 70 | × | ○ |
| 80 | × | ○ |
| 90 | ○ | ○ |

METHOD OF MANUFACTURING SEMICONDUCTOR DEVICE

CROSS REFERENCE TO RELATED APPLICATIONS

This is a continuation application of International Application PCT/JP2018/021925 filed on Jun. 7, 2018 which claims priority from a Japanese Patent Application No. 2017-136402 filed on Jul. 12, 2017, the contents of which are incorporated herein by reference.

BACKGROUND OF THE INVENTION

1. Field of the Invention

Embodiment of the invention related to a method of manufacturing a semiconductor device.

2. Description of the Related Art

Conventionally, it is commonly known that in fabricating (manufacturing) diodes and insulated gate bipolar transistors (IGBTs), processes for forming a diffusion region in a surface layer at a rear surface of a semiconductor wafer are performed while an element structure at a front surface of the semiconductor wafer is protected by a resist film (for example, refer to Japanese Laid-Open Patent Publication No. 2017-011000, International Publication No. WO 2013/108911). Further, it is commonly known that in forming a diffusion region in a surface layer at the rear surface of a semiconductor wafer, an impurity implanted at the rear surface of the semiconductor wafer is activated by a heat treatment of laser annealing (for example, refer to Japanese Laid-Open Patent Publication No. 2017-011000, International Publication No. WO 2013/108911, Japanese Laid-Open Patent Publication No. 2004-103841).

A method of manufacturing a conventional semiconductor device will be described taking, as an example, a case in which a free wheeling diode (FWD) is fabricated. FIG. 15 is a flowchart of an outline of a method of manufacturing a conventional semiconductor device. First, a diffusion region such as a p$^+$-type anode region is formed on a front surface side of a semiconductor wafer (step S101). Next, a front electrode that is electrically connected to the p$^+$-type anode region is formed at the front surface of the semiconductor wafer (step S102). Next, at the front surface of the semiconductor wafer, a passivation film such as a polyimide protective film that covers an edge termination region is formed in regions that become the semiconductor chip (step S103).

Next, a resist protective film that covers the front electrode and the polyimide protective film is formed; the resist protective film protects the front surface of the semiconductor wafer (step S104). Next, during rear surface grinding (back grinding (BG)) described hereinafter, a protective tape (hereinafter, BG tape) for protecting the front surface of the semiconductor wafer from foreign matter is affixed to the front surface of the semiconductor wafer (surface of the resist protective film) (step S105). Next, the semiconductor wafer is ground (rear surface grinding) from the rear surface and a thickness of the semiconductor wafer is reduced (step S106). Next, the BG tape is removed (step S107).

Next, a diffusion region of, for example, an n$^+$-type cathode region is formed toward the ground rear surface side of the semiconductor wafer by ion implantation (step S108). Next, a laser is irradiated from the rear surface of the semiconductor wafer and the surface layer at the rear surface of the semiconductor wafer is heated (laser annealing), whereby the impurity ion-implanted at step S108 is activated (step S109). Next, the resist protective film at the front surface of the semiconductor wafer is removed (step S110). Next, a rear electrode that is electrically connected to the n$^+$-type cathode region is formed at the rear surface of the semiconductor wafer (step S111). Thereafter, the semiconductor wafer is diced into individual chips, whereby the conventional semiconductor device is completed.

SUMMARY OF THE INVENTION

According to an embodiment, a method of manufacturing a semiconductor device includes forming an element structure at a front surface of a semiconductor substrate; forming a resist protective film on the front surface of the semiconductor substrate and protecting the element structure by the resist protective film; introducing an impurity from a rear surface of the semiconductor substrate, and forming a diffusion region near the rear surface of the semiconductor substrate; irradiating a laser from the rear surface of the semiconductor substrate and heating a rear surface side of the semiconductor substrate, and thereby activating the impurity; and removing the resist protective film. Before irradiating the laser, baking is performed that includes heating the resist protective film by a temperature of at least 100 degrees C. and evaporating water in the resist protective film.

In the embodiment, after introducing the impurity, the resist protective film is heated by the temperature of at least 100 degrees C.

In the embodiment, in the baking, the resist protective film is heated by a temperature less than a heat-resistant temperature of the resist protective film.

In the embodiment, in the baking, the resist protective film is heated by a temperature that is at most 200 degrees C.

In the embodiment, the method further includes grinding the semiconductor substrate from the rear surface and reducing a thickness of the semiconductor substrate after forming the resist protective film and before introducing the impurity. In introducing the impurity, the impurity is introduced from the rear surface after the grinding of the semiconductor substrate.

In the embodiment, forming the resist protective film includes applying a resist to the front surface of the semiconductor substrate and forming the resist protective film; and performing prebaking that includes heating the resist protective film and evaporating a solvent in the resist protective film.

In the embodiment, in the baking, the heating of the resist protective film and evaporating the water is performed under conditions identical to those for heating the resist protective film and evaporating the solvent in the prebaking.

In the embodiment, grinding the semiconductor substrate and reducing the thickness of the semiconductor substrate includes affixing a protective tape to an entire upper surface of the resist protective film, and planarizing the protective tape, and grinding the semiconductor substrate from the rear surface and reducing the thickness of the semiconductor substrate.

In the embodiment, the protective tape is removed before the baking.

Objects, features, and advantages of the present invention are specifically set forth in or will become apparent from the following detailed description of the invention when read in conjunction with the accompanying drawings.

BRIEF DESCRIPTION OF THE DRAWINGS

FIG. 3 is a cross-sectional view of the semiconductor device according to the first embodiment during manufacture.

FIG. 13 is a table depicting effects obtained by prebaking a resist protective film by a method of manufacturing the semiconductor device according a first example.

FIG. 14 is a table depicting effects obtained by prebaking a resist protective film by a method of manufacturing the semiconductor device according a second example.

DETAILED DESCRIPTION OF THE INVENTION

Figure 15:
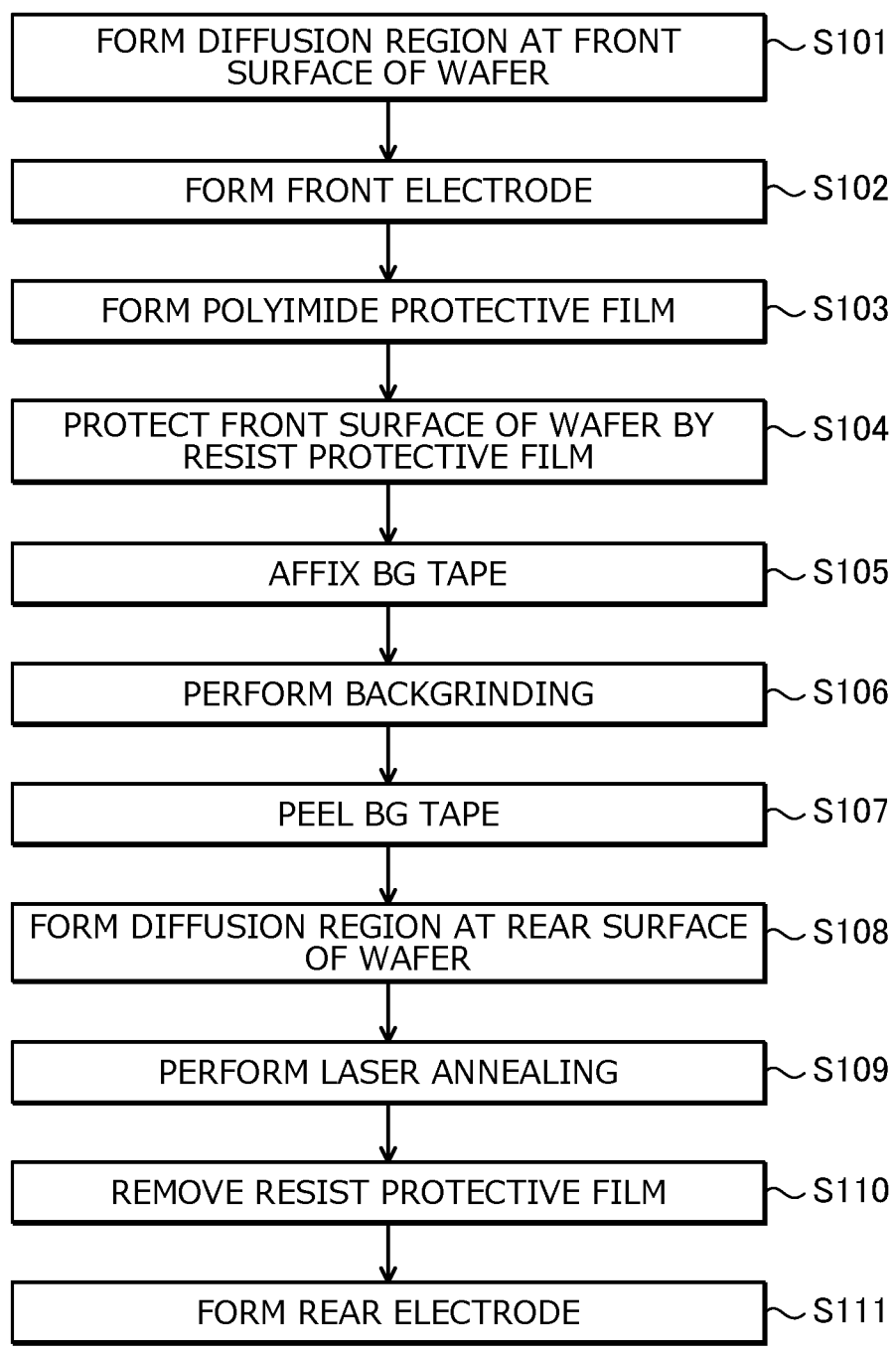
FIG. 15 is a flowchart of an outline of a method of manufacturing a conventional semiconductor device.

First, problems associated with the conventional techniques will be discussed. The laser annealing (step S109) in the method of manufacturing the conventional semiconductor device (refer to FIG. 15) heats a first main surface (herein, the rear surface) of the semiconductor wafer at a high temperature for short period of time. During the laser annealing applied to the first main surface of the semiconductor wafer, at a second main surface (herein, the front surface) of the semiconductor wafer, laser is not irradiated and it is possible for the low temperature of the second main surface to be maintained. Therefore, the resist protective film that protects the second main surface of the semiconductor wafer is not adversely affected by the heat generated by the laser annealing applied to the first main surface of the semiconductor wafer.

However, as the thickness of the semiconductor wafer decreases, the temperature of the semiconductor wafer at the second main surface thereof increases during the laser annealing at the first main surface of the semiconductor wafer. As a result, deterioration, peeling, deformation, etc. of the resist protective film at the second main surface of the semiconductor wafer occurs. Such problems occurring with the resist protective film significantly appear because the irradiation energy and the number of irradiations for performing impurity activation by laser annealing increase the deeper a diffusion region is formed from the surface from which the laser is irradiated.

When the resist protective film deteriorates, the resist protective film becomes difficult to remove and a chip on which the resist remains becomes a defective chip (defective product). When the resist protective film peels, at processes thereafter, the front surface of the semiconductor substrate may become contaminated or scratched at sites where the resist protective film peeled, and defective chips result due to these sites that are contaminated or scratched. Further, when foaming of the resist protective film occurs, spattered resist may become a source of particle generation, leading to defective chips.

Embodiments of a method of manufacturing a semiconductor device according to the present invention will be described in detail with reference to the accompanying drawings. In the present description and accompanying drawings, layers and regions prefixed with n or p mean that majority carriers are electrons or holes. Additionally, + or − appended to n or p means that the impurity concentration is higher or lower, respectively, than layers and regions without + or −. In the description of the embodiments below and the accompanying drawings, main portions that are identical will be given the same reference numerals and will not be repeatedly described.

Figure 1:
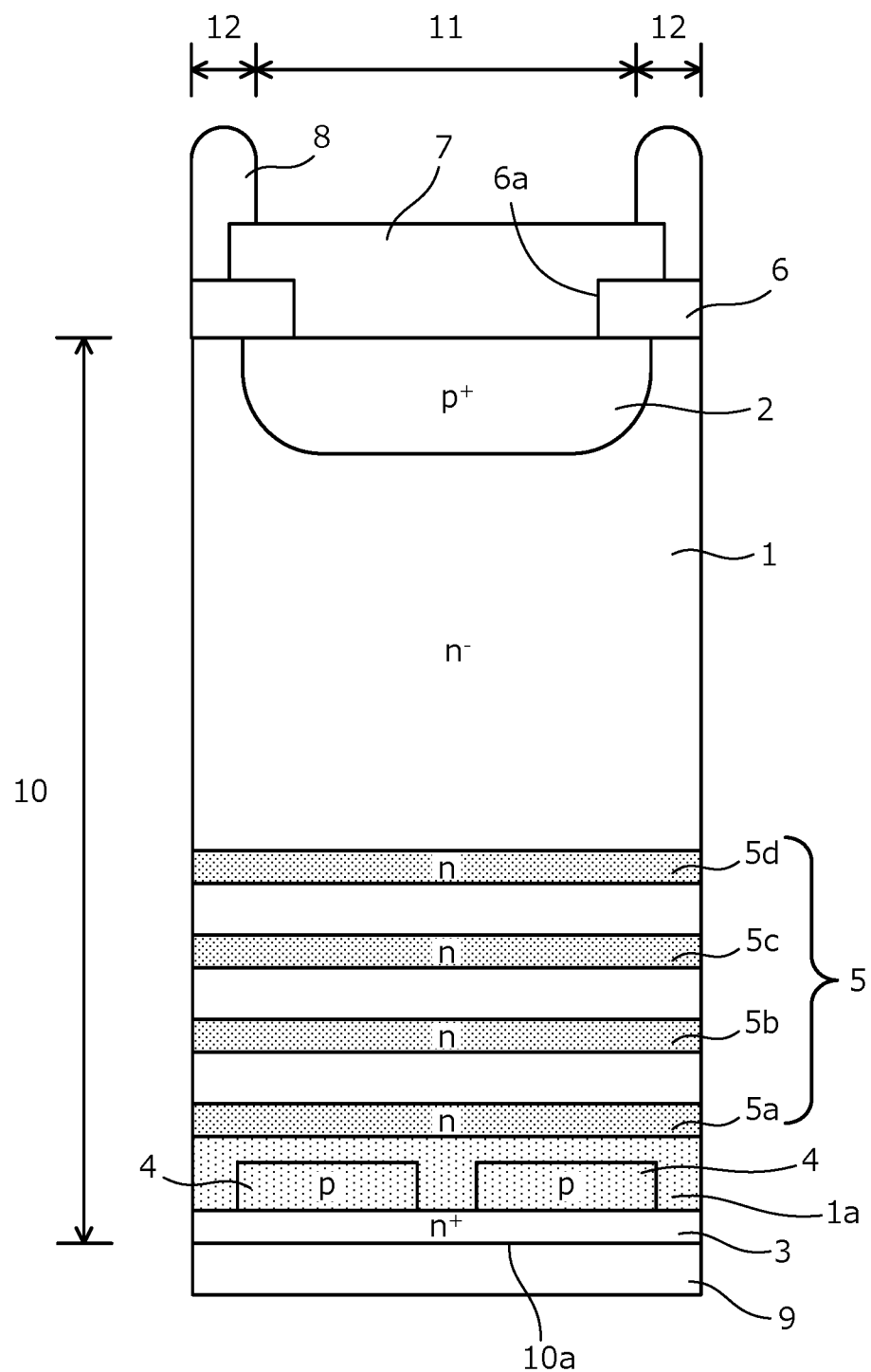
FIG. 1 is a cross-sectional view of an example of a semiconductor device manufactured by a method of manufacturing the semiconductor device according to a first embodiment.

A structure of a semiconductor device fabricated (manufactured) by the method of manufacturing a semiconductor device according to a first embodiment will be described. FIG. 1 is a cross-sectional view of an example of the semiconductor device manufactured by the method of manufacturing the semiconductor device according to the first embodiment. The semiconductor device according to the first embodiment depicted in FIG. 1 is a free wheeling diode (FWD) that has a floating (electrically floating) p-type region 4 at a position that is deeper from a rear surface of a semiconductor substrate (semiconductor chip) 10 of an n$^-$type than is an n$^+$-type cathode region 3.

In particular, as depicted in FIG. 1, a p$^+$-type anode region 2 is selectively provided in a surface layer at a front surface of the semiconductor substrate 10 that is an n$^-$-type and constitutes an n$^-$-type drift region 1. The p$^+$-type anode region 2, for example, is provided at the front surface of the semiconductor substrate 10 overall in an active region 11. The p$^+$-type anode region 2 may extend from the active region 11 into the edge termination region 12. In FIG. 1, while only one unit cell (configuration unit of an element) of the FWD is depicted, plural unit cells may be disposed adjacent to each other in the active region 11.

The active region 11 is a region in which main current flows when an element (FWD) is ON and is a region that is exposed at an opening of a polyimide protective film 8. The edge termination region 12 is a region between the active region 11 and a side surface of the semiconductor substrate 10, and is a region for mitigating electric field at a substrate front surface side of the n⁻-type drift region 1 and for sustaining breakdown voltage (withstand voltage). The breakdown voltage is a voltage limit at which no errant operation or damage of the element occurs. In the edge termination region 12, a voltage structure combining, for example, a guard ring, a field plate and a RESURF is disposed.

The n⁺-type cathode region 3 is provided in a surface layer at the rear surface of the semiconductor substrate 10 and spans the active region 11 and the edge termination region 12. Further, the p-type region 4 is selectively provided in the surface layer at the rear surface of the semiconductor substrate 10, at a position that is deeper from the rear surface of the semiconductor substrate 10 than is the n⁺-type cathode region 3. The p-type region 4 is disposed in plural, at a predetermined interval along a direction parallel to the rear surface of the semiconductor substrate 10. The floating (electrically floating) p-type regions 4 are disposed separated from a rear electrode 9 described hereinafter. The p-type regions 4 may be in contact with the n⁺-type cathode region 3.

A portion of the semiconductor substrate 10 other than the p⁺-type anode region 2, the n⁺-type cathode region 3 and the p-type regions 4 constitutes the n⁻-type drift region 1. In the n⁻-type drift region 1, an n-type field stop (FS) region 5 is disposed spanning the active region 11 and the edge termination region 12. The n-type FS region 5 is disposed near the n⁺-type cathode region 3. Further, the n-type FS region 5 is disposed at a position that is deeper from the rear surface of the semiconductor substrate 10 than is the p-type region 4. The n-type FS region 5 may be in contact with the n⁺-type cathode region 3 and the p-type region 4.

The n-type FS region 5 is a hydrogen donor layer that contains hydrogen atoms and is formed by ionizing (making donors of) hydrogen atoms introduced in the semiconductor substrate 10 by proton (H⁺) ion implantation. The n-type FS region 5 demonstrates, at a depth position of a range Rp of proton implantation, a peak value (maximum value) impurity concentration higher than the impurity concentration of the semiconductor substrate 10. The n-type FS region 5 may be disposed in plural at differing depths from the rear surface of the semiconductor substrate 10. In this case, a peak of the impurity concentration of each of the n-type FS regions 5 is at a position (hereinafter, peak position) separated from other n-type FS regions 5.

Figure 10:
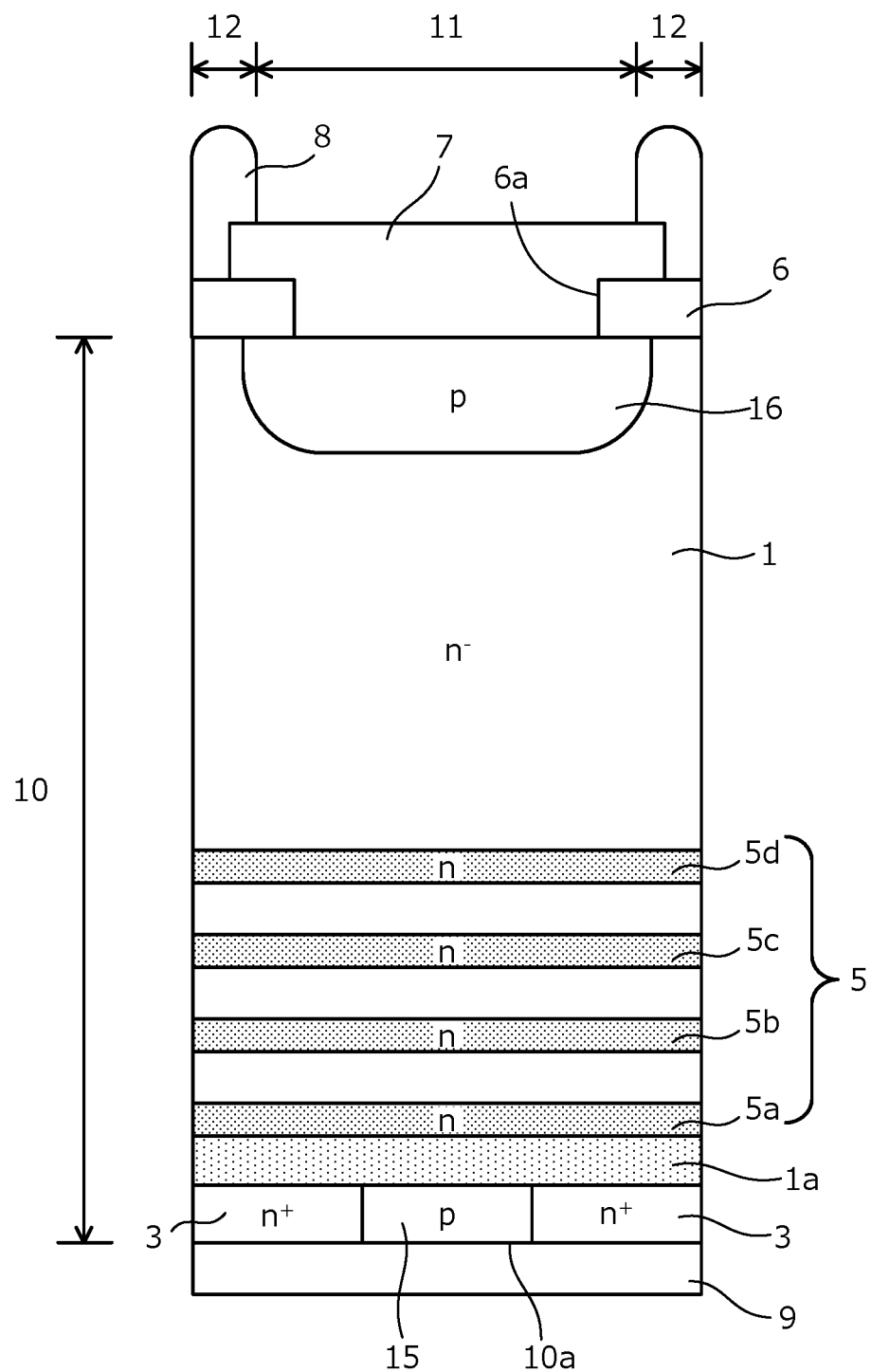
FIG. 10 is a cross-sectional view of another example of a semiconductor device manufactured by the method of manufacturing the semiconductor device according to the first embodiment.
Figure 11:
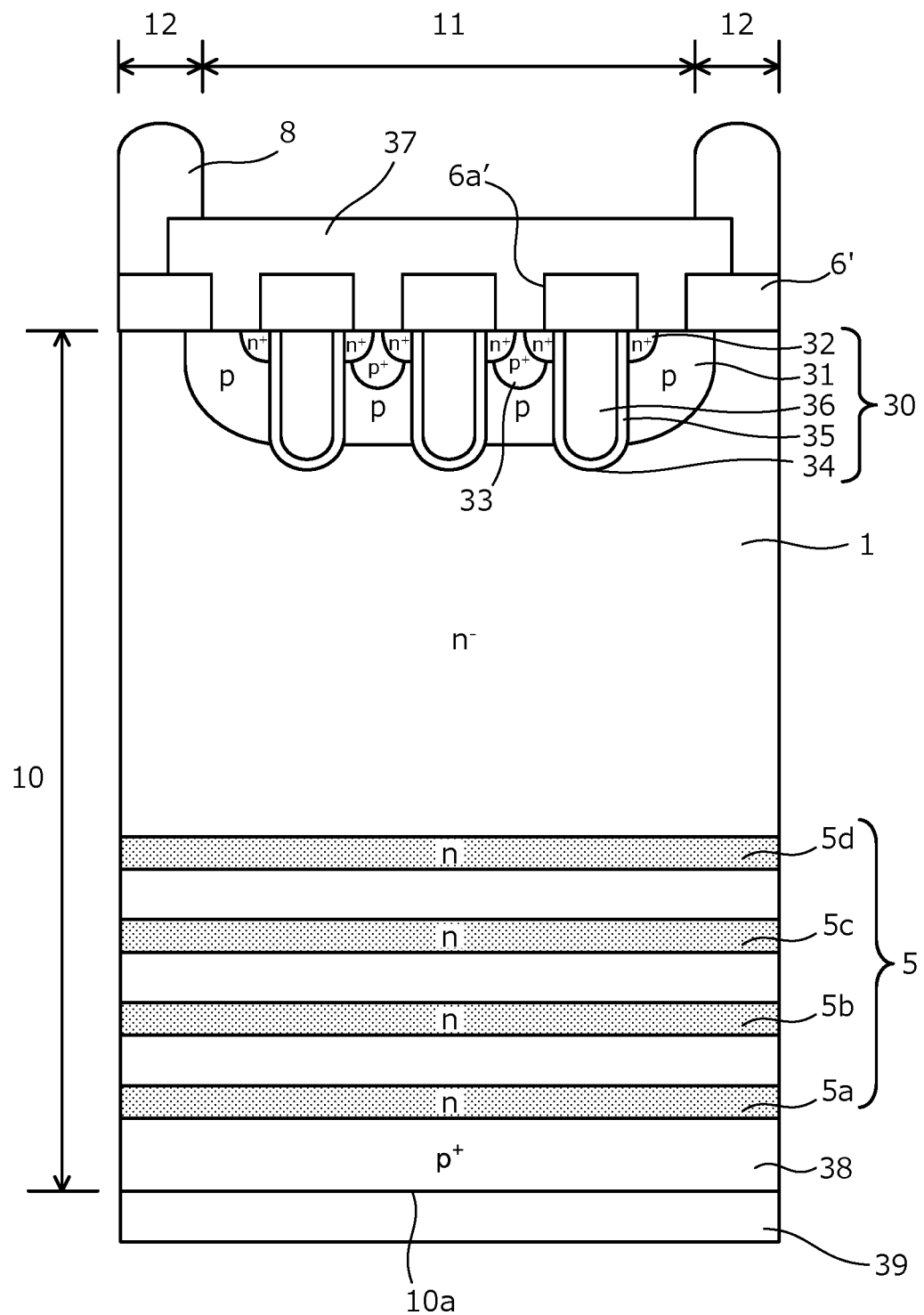
FIG. 11 is a cross-sectional view of an example of a semiconductor device fabricated (manufactured) by the method of manufacturing the semiconductor device according to a second embodiment.
Figure 12:
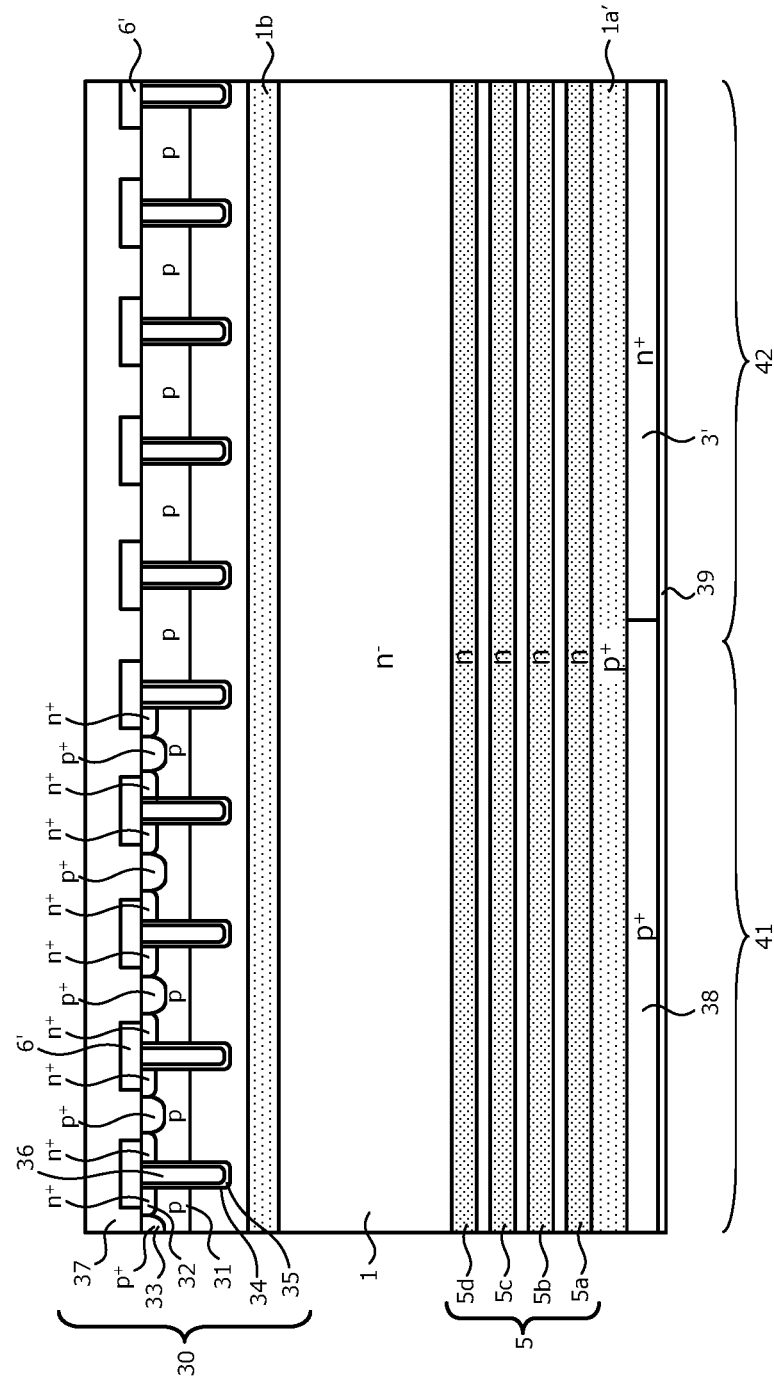
FIG. 12 is a cross-sectional view of an example of a semiconductor device manufactured by the method of manufacturing the semiconductor device according to a third embodiment.

In FIG. 1, the n-type FS regions 5 are disposed separated from the p-type region 4, four of the n-type FS regions 5 are disposed, and sequentially from the rear surface of the semiconductor substrate 10, reference characters 5a to 5d are assigned thereto (similarly in FIGS. 10 to 12). The n-type FS regions 5a to 5d are formed by proton implantations for which the range Rp from the rear surface of the semiconductor substrate 10 differs thereamong. Each of the n-type FS regions 5a to 5d indicates by hatching, a portion that has a width that is straggling (different (varies) from the range Rp due to a stochastic process such as energy loss during proton implantation) ΔRp relative to the range Rp of proton implantation, and where the impurity concentration is at least half of the value of the maximum concentration.

Portions sandwiched between the hatched portions of the n-type FS regions 5a to 5d, and a portion sandwiched between the hatched portion of the n-type FS region 5a and the n⁺-type cathode region 3 are portions having reduced disorder. Disorder is a portion left by the proton implantation and has a significantly lower impurity concentration than that of the semiconductor substrate 10. Crystal defects may be uniformly introduced in the entire n⁻-type drift region 1 by electron beam (EB) irradiation, or crystal defects may be introduced in a portion 1a of a cathode side of the n⁻-type drift region 1 by helium (He) implantation. In FIG. 1, the portion 1a of the cathode side of the n⁻-type drift region 1 and in which crystal defects are introduced by helium implantation is indicated by hatching that is lighter than that of the n-type FS regions 5 (similarly in FIGS. 10 and 12).

An interlayer insulating film 6 covers the front surface of the semiconductor substrate 10 in the edge termination region 12. In a contact hole 6a that is an opening in the interlayer insulating film 6, the front surface of the semiconductor substrate 10 (i.e., the p⁺-type anode region 2) in the active region 11 is exposed. A front electrode 7 is disposed so as to be embedded in the contact hole 6a, the front electrode 7 being in contact with the p⁺-type anode region 2 and electrically connected to the p⁺-type anode region 2. In other words, the front electrode 7 functions as an anode electrode. The front electrode 7 may extend onto the interlayer insulating film 6.

The polyimide protective film 8 covers an end of the front electrode 7 and the interlayer insulating film 6, in the edge termination region 12. The polyimide protective film 8 is a passivation film that protects the semiconductor chip from mechanical stress and impurity penetration. The interlayer insulating film 6 and the polyimide protective film 8 surround a periphery of the active region 11. The rear electrode 9 is provided at the entire rear surface of the semiconductor substrate 10, is in contact with the n⁺-type cathode region 3, and is electrically connected to the n⁺-type cathode region 3. In other words, the rear electrode 9 functions as a cathode electrode.

Figure 2A:
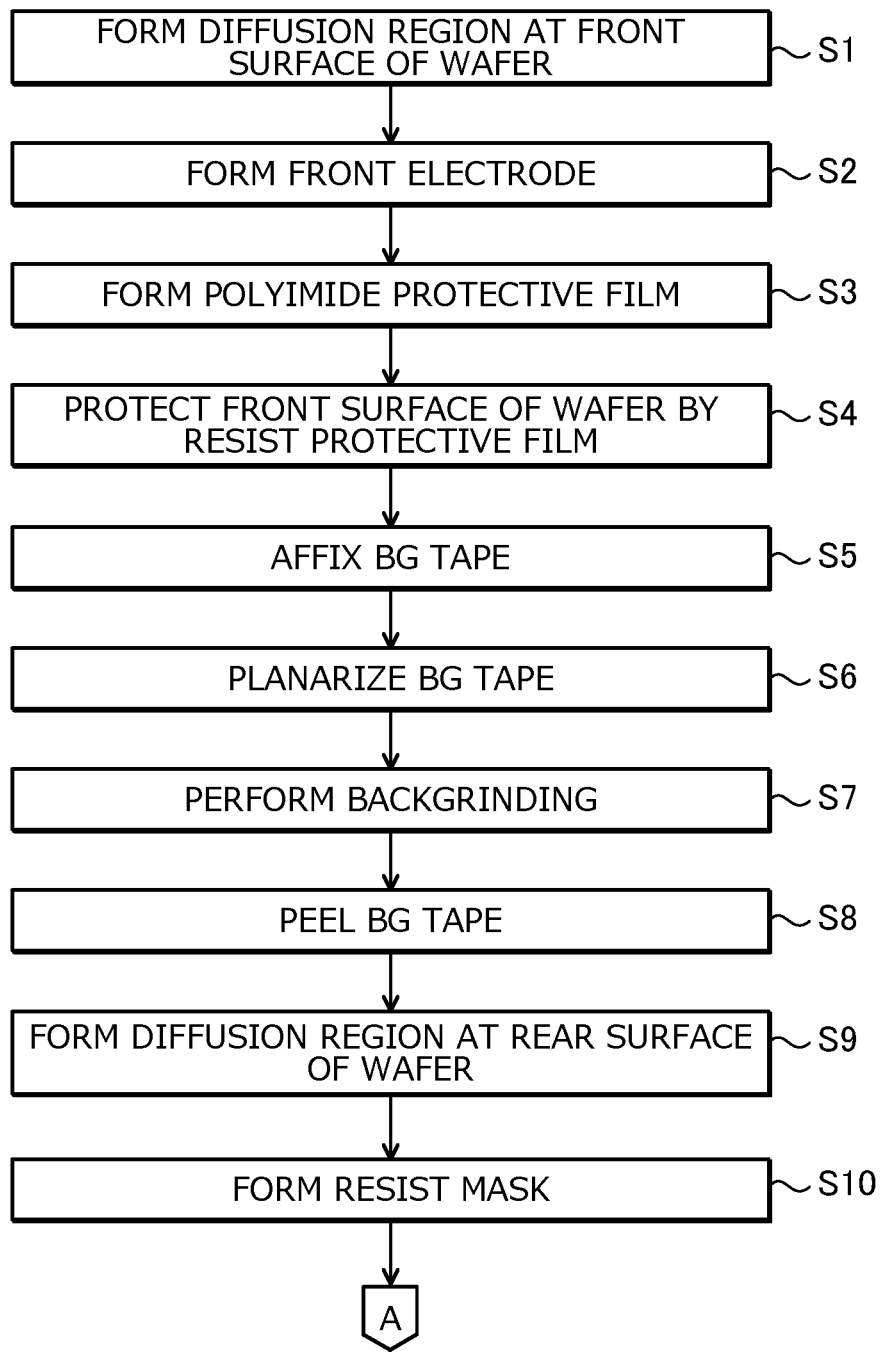
FIG. 2A is a flowchart of an outline of the method of manufacturing the semiconductor device according to the first embodiment.
Figure 2B:
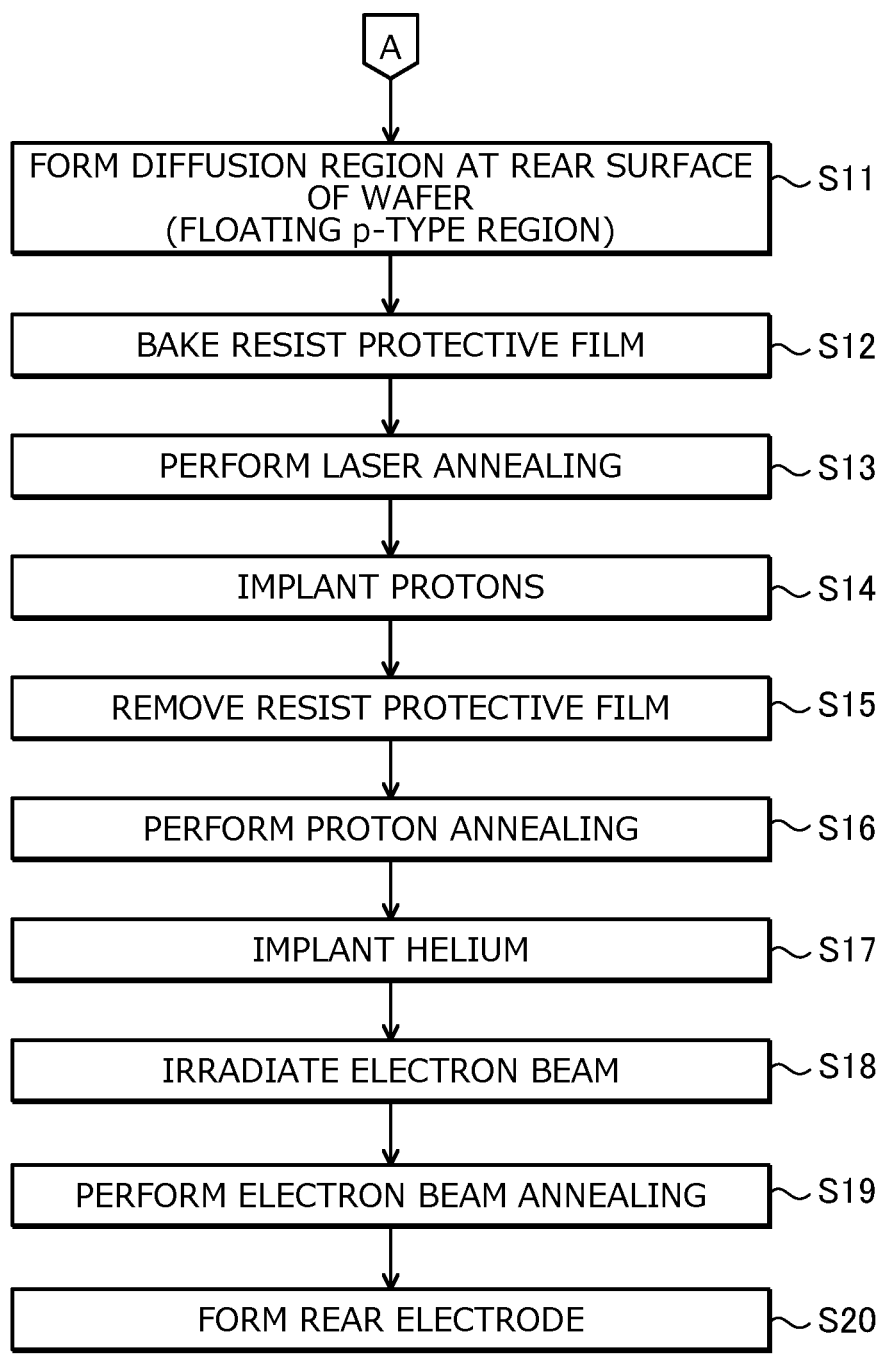
FIG. 2B is a flowchart of an outline of the method of manufacturing the semiconductor device according to the first embodiment.
Figure 4:
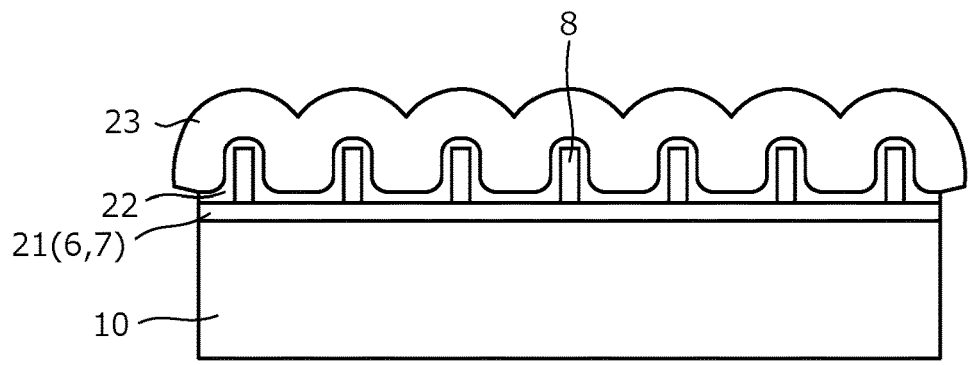
FIG. 4 is a cross-sectional view of the semiconductor device according to the first embodiment during manufacture.
Figure 5:
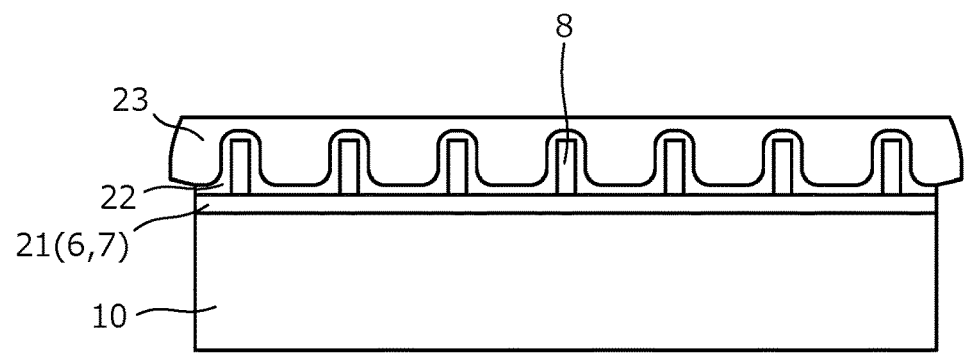
FIG. 5 is a cross-sectional view of the semiconductor device according to the first embodiment during manufacture.

The method of manufacturing the semiconductor device according to the first embodiment will be described. FIGS. 2A and 2B are flowcharts of an outline of the method of manufacturing the semiconductor device according to the first embodiment. FIGS. 3, 4, 5, 6, 7 and 8 are cross-sectional views of the semiconductor device according to the first embodiment during manufacture. In FIGS. 3 to 8, diffusion regions such as the p⁺-type anode region 2 near the front surface of the semiconductor substrate 10 are not depicted. Further, in FIGS. 3 to 8, the interlayer insulating film 6 and the front electrode 7 on the front surface of the semiconductor substrate 10 are depicted as a single layer 21. First, the semiconductor substrate (semiconductor wafer) 10 of an n⁻ type and constituting the n⁻-type drift region 1 is prepared.

Next, a diffusion region that becomes the p⁺-type anode region 2 is formed at the front surface of the semiconductor substrate 10 by ion implantation (step S1). At step S1, for example, a voltage structure such as a guard ring (p-type region) may be formed in the edge termination region 12. Next, the front surface of the semiconductor substrate 10 is covered by the interlayer insulating film 6. Next, a portion of the interlayer insulating film 6 corresponding to the active region 11 is removed, the contact hole 6a is formed, and in the contact hole 6a, the p⁺-type anode region 2 is exposed. Next, the front electrode 7 is formed on the front surface of the semiconductor substrate 10 and the interlayer insulating film 6 so as to be embedded in the contact hole 6a (step S2).

Next, for example, the front electrode 7 is patterned and a portion of the front electrode 7, the portion extending on the interlayer insulating film 6 from inside the contact hole 6a is left. Next, in each region 20 constituting a semiconductor chip, on the front surface of the semiconductor substrate 10 (on the interlayer insulating film 6), the polyimide protective film 8 is formed covering the edge termination region 12 (step S3). The polyimide protective film 8 protrudes a predetermined height h from the front electrode 7 (in FIG. 3, corresponds to the layer 21) at the front surface of the semiconductor substrate 10. Therefore, at the front surface of the semiconductor substrate 10, unevenness occurs due to the front electrode 7 and the polyimide protective film 8 (refer to FIG. 3).

Next, by a general method, a resist protective film 22 is formed on the front surface of the semiconductor substrate 10, the front surface of the semiconductor substrate 10 (surfaces of the front electrode 7 and the polyimide protective film 8) are protected by the resist protective film 22 (step S4). At a surface of the resist protective film 22, unevenness corresponding to the unevenness of the front electrode 7 and the polyimide protective film 8 occurs. At step S4, conditions of a heat treatment (prebaking) to evaporate a solvent contained in the resist protective film 22 may be, for example, about 150 degrees C. for about 30 minutes, or about 150 degrees C. for about 60 minutes.

A reason for protecting the front surface of the semiconductor substrate 10 by the resist protective film 22 is that at a subsequent process, a component of manufacturing equipment comes in contact with the front surface of the semiconductor substrate 10 (such as when the semiconductor substrate 10 is held by a conveyance hand, the semiconductor substrate 10 is placed on a stage, etc.), whereby contamination of the front surface of the semiconductor substrate 10 occurs. The resist protective film 22 has a function of preventing contamination, scratches, and damage at the front surface of the semiconductor substrate 10 during a process performed after a BG tape 23 described hereinafter is peeled from the front surface of the semiconductor substrate 10.

A thickness of the resist protective film 22 may be at least a thickness enabling complete coverage of the front electrode 7 and the polyimide protective film 8 and, for example, may be 1 µm or more, or may be 3 µm or more in practice. Further, while increased thickness of the resist protective film 22 enhances a protective function of the resist protective film 22 with respect to the front surface of the semiconductor substrate 10, the amount of resist applied and application time increase, whereby special application equipment and peeling equipment become necessary, thereby increasing cost. Therefore, with consideration of cost, an upper limit of the thickness of the resist protective film 22 is about 50 µm.

Next, the back grinding (BG) tape 23 is affixed to the front surface of the semiconductor substrate 10 (surface of the resist protective film 22) (step S5). Here, at a surface of the BG tape 23, unevenness corresponding to the unevenness of the front electrode 7 and the polyimide protective film 8 occurs (refer to FIG. 4). Therefore, next, for example, the BG tape 23 is ground and a surface layer of the BG tape 23 is removed, whereby the surface of the BG tape 23 is planarized (step S6, refer to FIG. 5). Planarization of the surface of the BG tape 23 enables the rear surface of the semiconductor substrate 10 to be prevented from having a waved shape corresponding to the unevenness of the front surface of the semiconductor substrate 10 and prevents cracks from occurring in the semiconductor substrate 10 during grinding (described hereinafter) of the rear surface of the semiconductor substrate 10.

The BG tape 23 is an adhesive tape having a 2-layer construction of at least an adhesive layer and a base layer, and is affixed to the resist protective film 22 utilizing, for example, the self-adhesiveness of the adhesive layer. The BG tape 23 protects the front surface of the semiconductor substrate 10 during the grinding (back grinding) described hereinafter of the rear surface of the semiconductor substrate 10 and prevents the front surface of the semiconductor substrate 10 from being contaminated by grinding debris during grinding of the rear surface of the semiconductor substrate 10, water (hereinafter, grinding water) supplied between a grindstone and grinding surface, etc. While increased thickness of the BG tape 23 is favorable, cost increases with increased thickness and therefore, with consideration of cost, for example, the thickness may be in a range from about 50 µm to 300 µm.

Figure 6:
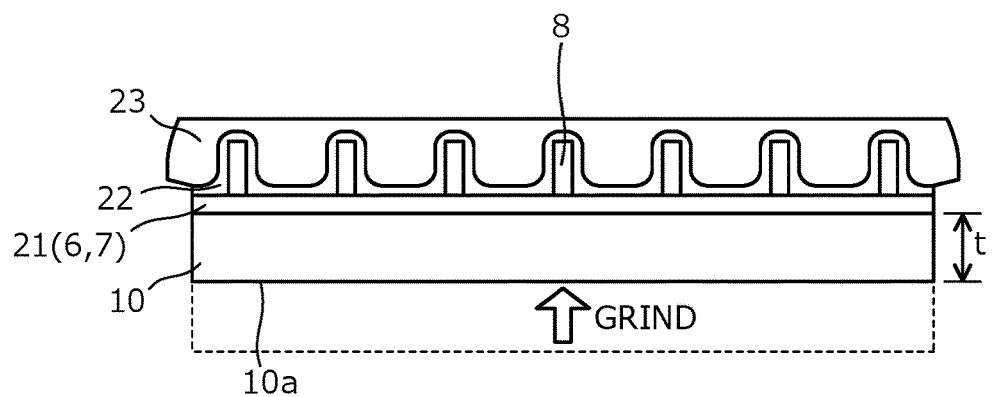
FIG. 6 is a cross-sectional view of the semiconductor device according to the first embodiment during manufacture.

Next, the semiconductor substrate 10 is ground from the rear surface side (rear surface grinding), to a position corresponding to a product thickness t for use as a semiconductor device (step S7, refer to FIG. 6). Next, the BG tape 23 is peeled, whereby a surface (surface of the resist protective film 22) not contaminated by grinding debris or grinding water is exposed at the front surface of the semiconductor substrate 10 (step S8). At step S8, peeling of the BG tape 23 enables foreign particles such as grinding debris of the semiconductor substrate 10 to be prevented from being conveyed to a subsequent process (for example, an ion implantation process, laser annealing process).

Next, in a surface layer of a rear surface 10a of the semiconductor substrate 10 after grinding, a diffusion region that becomes the $n^+$-type cathode region 3 is formed by ion-implantation of an n-type impurity (step S9). Next, at the rear surface 10a of the semiconductor substrate 10, a resist mask (not depicted) having openings at portions corresponding to formation regions of the floating p-type region 4 is formed (step S10). Next, the resist mask is used as a mask, a p-type impurity is ion-implanted, and diffusion regions that become the floating p-type regions 4 are formed at positions that are deeper from the rear surface 10a of the semiconductor substrate 10 than is the $n^+$-type cathode region 3 (step S11). Subsequently, the resist mask used in forming the p-type region 4 is removed.

Figure 7:
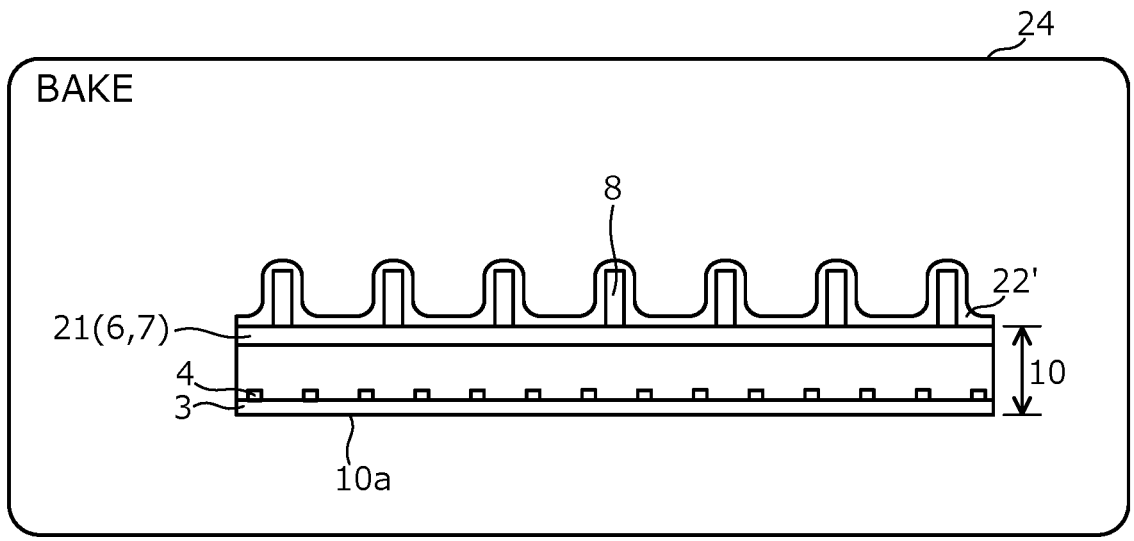
FIG. 7 is a cross-sectional view of the semiconductor device according to the first embodiment during manufacture.

The resist protective film 22 absorbs water ($H_2O$) in the atmosphere (ambient air, gas atmosphere) of the processes at steps S7 to S11 or in the ambient air while the semiconductor substrate 10 is standing-by between these processes, or cleaning water ($H_2O$) used in cleaning the semiconductor substrate 10 during the processes at steps S7 to S11. For example, the inventor confirmed that when the semiconductor substrate 10 is left for 24 hours in ambient air, the amount of moisture contained in the resist protective film 22 returns to about a same amount as the amount the solvent contained in the resist protective film 22 before the prebaking performed in the process at step S4. Therefore, immediately before the laser annealing described hereinafter, a heat treatment (baking) is performed to evaporate the water in the resist protective film 22 (step S12, refer to FIG. 7). In other words, the procedure may be such that no treatments that use water are performed after the baking of the resist protective film 22 and the laser annealing described hereinafter is performed as soon as possible after the baking. In FIG. 7, the resist protective film 22 after baking is indicated by reference numeral 22'. Reference numeral 24 is a heat treatment furnace for baking the resist protective film 22.

At step S12, a baking temperature of the resist protective film 22 is at least the boiling point of water (100 degrees C.) but less than the heat-resistant temperature of the resist protective film 22. While the heat-resistant temperature of the resist protective film 22 varies according to the composition of the resist protective film 22, in particular, the baking temperature of the resist protective film 22, for example, may be in a range from about 100 degrees C. to 200 degrees C. A baking period of the resist protective film 22, for example, may be in a range from about 1 minute to 2 hours, or may be in a range from about 30 to 60 minutes. Setting the baking period of the resist protective film 22 to 2 hours or less enables increases in cost to be suppressed and enables productivity to be enhanced. The baking period of the resist protective film 22 may be shortened by using a high-cost baking furnace (heat treatment furnace) enabling high controllability of temperature. The atmosphere in which the resist protective film 22 is baked may be other than a high-humidity atmosphere and may be an atmosphere of atmospheric air (no gas is supplied), an oxygen ($O_2$) atmosphere, or an inert gas atmosphere such as argon (Ar). Further, baking of the resist protective film 22 may be performed under the same conditions as prebaking of the resist protective film 22 performed at step S4. When the resist protective film 22 is baked for a long period at a temperature near the heat-resistant temperature of the resist protective film 22, the resist protective film 22 deteriorates and becomes difficult to peel. Therefore, the baking temperature of the resist protective film 22 and the baking period may be set to conditions whereby the resist protective film 22 does not deteriorate.

Figure 8:
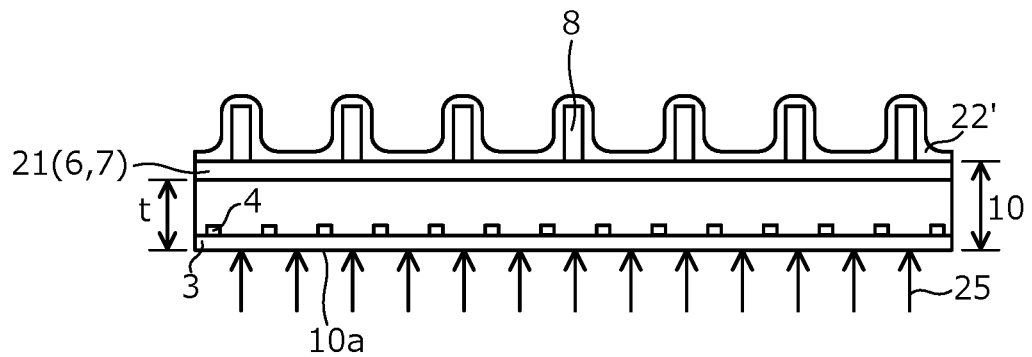
FIG. 8 is a cross-sectional view of the semiconductor device according to the first embodiment during manufacture.

Next, a laser 25 is irradiated from the rear surface 10a of the semiconductor substrate 10 and a surface layer of the rear surface 10a of the semiconductor substrate 10 is heated (laser annealing), whereby the impurities ion-implanted at steps S9 and S11 are activated (step S13, refer to FIG. 8). In other words, only the surface layer of the rear surface 10a of the semiconductor substrate 10 is heated by this laser annealing and only the $n^+$-type cathode region 3 and the p-type region 4 near the rear surface 10a of the semiconductor substrate 10 are activated.

During the laser annealing, the temperature near the rear surface 10a of the semiconductor substrate 10 increases to a range from 1200 degrees C. to 3000 degrees C. Therefore, as the product thickness t of the semiconductor substrate 10 decreases, the temperature toward the front surface of the semiconductor substrate 10 increases and the resist protective film 22 of the front surface of the semiconductor substrate 10 is heated. In the method of manufacturing the conventional semiconductor device (refer to FIG. 15), heating of the resist protective film boils the water contained in the resist protective film. As a result, problems occur such as the resist protective film deteriorates; the resist protective film foams and generated air bubbles occur in the resist protective film. In contrast, in the described embodiment, before the laser annealing of the rear surface 10a of the semiconductor substrate 10, the resist protective film 22 is baked, whereby in the resist protective film 22, moisture absorbed from after the prebaking of the resist protective film 22 until before the laser annealing is evaporated. In the resist protective film 22' after baking, substantially no moisture is present and therefore, in the subsequent laser annealing of the rear surface 10a of the semiconductor substrate 10, even when the resist protective film 22' is heated, deterioration of the resist protective film 22' and generation of air bubbles in the resist protective film 22' are suppressed.

In the laser annealing at step S13, for example, the laser 25 may be scanned parallel to the rear surface 10a of the semiconductor substrate 10 and irradiated at an overlap rate (ratio of mathematical areas of overlapping portions of the laser 25) of, for example, at least 50% both longitudinally and laterally. In other words, the rear surface 10a of the semiconductor substrate 10 may be divided into a grid and in each section thereof, the laser 25 may be irradiated repeatedly 2 or more times longitudinally and 2 or more times laterally (total: 4 or more times). As the laser 25, for example, a YAG2ω (second harmonic Yttrium Aluminum Garnet (YAG) laser having a wavelength of 537 nm), a second harmonic YLF (Yttrium Lithium Fluoride ($YLiF_4$)) laser having a wavelength of 532 nm may be used. A pulse width of the laser 25, for example, in the half-width may be in a range from about 100 ns to 300 ns. Energy density of the laser 25 may be in a range from 1.6 $J/cm^2$ to 2.0 $J/cm^2$, irradiated 2 times with a delay time in a range from 100 ns to 500 ns. A frequency of the laser 25, for example, may be in a range from about 1 kHz to 3 kHz.

Next, hydrogen atoms are introduced into the semiconductor substrate 10 by proton implantation from the rear surface 10a of the semiconductor substrate 10 to a position deeper than the p-type region 4 (step S14). At step S14, multistage proton implantation (implantation performed plural times) in which the range Rp respectively differs may be repeatedly performed. Next, the resist protective film 22' of the front surface of the semiconductor substrate 10 is removed, for example, by a dissolution treatment using a chemical solution, ashing treatment, etc. (step S15).

Next, the hydrogen atoms introduced into the semiconductor substrate 10 at step S14 are ionized (made into donors) by a heat treatment (hereinafter, proton annealing) (step S16). By this proton annealing, the n-type FS regions 5 (5a to 5d) constituting hydrogen donor layers are formed at depth positions of the range Rp of the proton implantation. Next, helium is implanted from the rear surface 10a of the semiconductor substrate 10, and crystal defects are introduced in the portion 1a of the cathode side of the $n^-$-type drift region 1 (step S17).

Next, an electron beam is irradiated from the front surface of the semiconductor substrate 10 or the rear surface 10a and crystal defects (for example, point defects) are introduced in the $n^-$-type drift region 1 (step S18). Next, the semiconductor substrate 10 is heated (hereinafter, electron beam annealing), and the amount of crystal defects in the $n^-$-type drift region 1 is adjusted (step S19). When the amount of crystal defects formed in the $n^-$-type drift region 1 by helium implantation and electron beam irradiation is suitable, the electron beam annealing may be omitted.

Next, at the rear surface 10a of the semiconductor substrate 10, the rear electrode 9 that is electrically connected to the $n^+$-type cathode region 3 is formed (step S20). Thereafter, the semiconductor substrate 10 is cut (diced) into individual chips, whereby the FWD depicted in FIG. 1 is completed.

Figure 9:
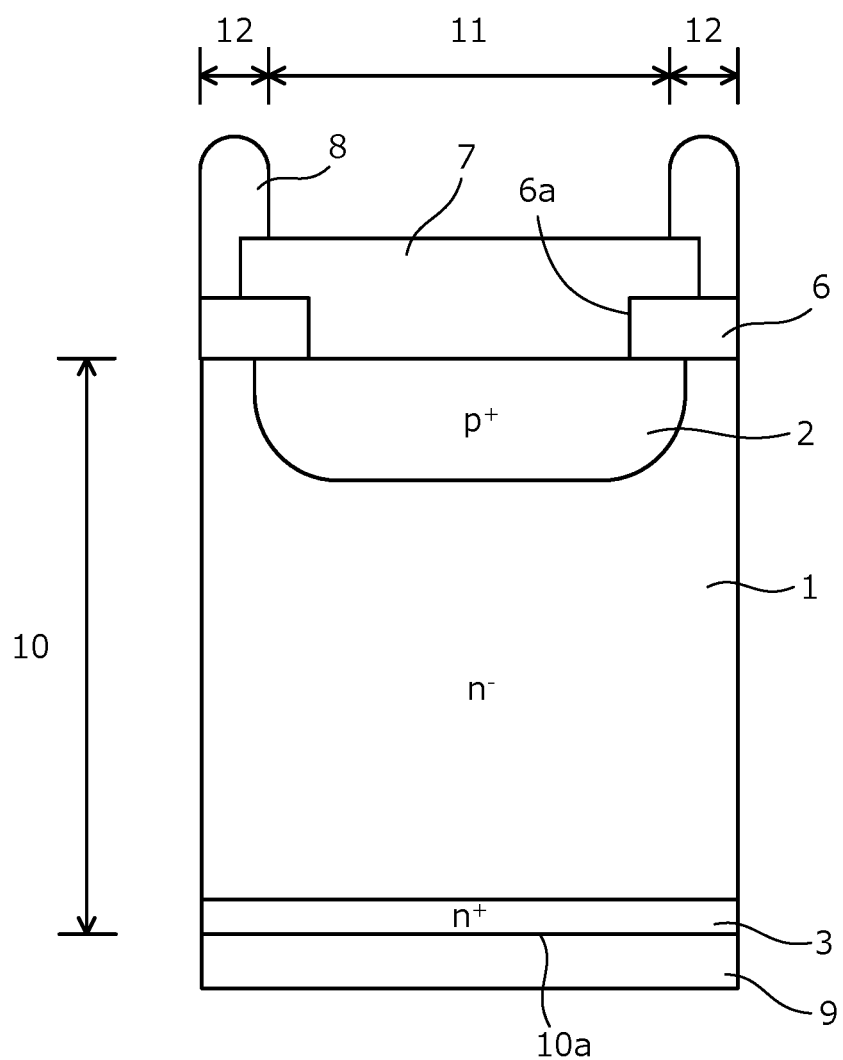
FIG. 9 is a cross-sectional view of another example of a semiconductor device manufactured by the method of manufacturing the semiconductor device according to the first embodiment.

The described method of manufacturing the semiconductor device according to the first embodiment is further applicable to a general FWD that does not have the n-type FS region 5 or the floating p-type region 4 depicted in FIG. 9. FIG. 9 is a cross-sectional view of another example of a semiconductor device manufactured by the method of manufacturing the semiconductor device according to the first embodiment. The FWD depicted in FIG. 9 differs from the FWD depicted in FIG. 1 in that the FWD depicted in FIG. 9 does not have the n-type FS region 5 or the p-type region 4, and helium implantation is not performed in the $n^-$-type drift region 1.

A method of manufacturing the FWD depicted in FIG. 9 further includes in the described method of manufacturing the semiconductor device according to the first embodiment (refer to FIGS. 2A and 2B), omitting the processes at steps S11, S14, S16, and S17, and in the laser annealing at step S13, activating only the $n^+$-type cathode region 3.

The described method of manufacturing the semiconductor device according to the first embodiment is further applicable to a FWD that includes a p-type cathode region 15 in the $n^+$-type cathode region 3 depicted in FIG. 10. FIG. 10 is a cross-sectional view of another example of a semiconductor device manufactured by the method of manufacturing the semiconductor device according to the first embodiment. The FWD depicted in FIG. 10 differs from the FWD depicted in FIG. 1 in that the FWD depicted in FIG. 10 includes the p-type cathode region 15 in the $n^+$-type cathode region 3 and instead of the $p^+$-type anode region 2 depicted in FIG. 1, further includes a p-type anode region 16 that has an impurity concentration that is lower than that of the $p^+$-type anode region 2.

A portion of the semiconductor substrate 10 other than the p-type anode region 16, the $n^+$-type cathode region 3, and the p-type cathode region 15 is the $n^-$-type drift region 1. In the surface layer at the rear surface of the semiconductor substrate 10, the p-type cathode region 15 is disposed parallel to the $n^+$-type cathode region 3 along a direction that is parallel the rear surface of the semiconductor substrate 10 and the p-type cathode region 15 is in contact with the $n^-$-type drift region 1. The p-type cathode region 15 is disposed at a same depth from the rear surface of the semiconductor substrate 10 as, for example, the $n^+$-type cathode region 3. The rear electrode 9 is in contact with the $n^+$-type cathode region 3 and the p-type cathode region 15, and is electrically connected to the $n^+$-type cathode region 3 and the p-type cathode region 15.

A method of manufacturing the FWD depicted in FIG. 10 further includes in the described method of manufacturing the semiconductor device according to the first embodiment (refer to FIGS. 2A and 2B), reducing the impurity concentration when forming an anode region at step S1 and forming the p-type anode region 16. Further, in forming the diffusion region at step S9, the diffusion region of the $n^+$-type cathode region 3 and the diffusion region of the p-type cathode region 15 are formed. Further, in the laser annealing at step S13, the $n^+$-type cathode region 3 and the p-type cathode region 15 are activated.

As described above, according to the first embodiment, before the laser annealing of the rear surface of the semiconductor substrate (semiconductor wafer), the resist protective film that protects the front surface of the semiconductor substrate is baked and water in the resist protective film is evaporated. As a result, during the laser annealing of the rear surface of the semiconductor substrate, even when the resist protective film of the front surface of the semiconductor substrate is heated, substantially no water that may boil due to this heat is present in the resist protective film. Therefore, even when the product thickness of the semiconductor substrate is reduced, during the laser annealing of the rear surface of the semiconductor substrate, deterioration of the resist protective film and mixing of air bubbles in the resist protective film may be suppressed. Further, suppression of mixing of air bubbles in the resist protective film enables suppression of peeling and deformation of the resist protective film. Therefore, as compared to the method of manufacturing the conventional semiconductor device (refer to FIG. 15), the product thickness of the semiconductor substrate may be reduced and an occurrence rate of defective chips may be reduced. Alternatively, when the product thickness of the semiconductor substrate is equal to that in the method of manufacturing the conventional semiconductor device, the impurity activation of a diffusion region formed at a position deeper from the rear surface of the semiconductor substrate as compared to the method of manufacturing the conventional semiconductor device may be performed. Further, the first embodiment is useful in a case where a low-cost resist having high water absorption is used as a material of the resist protective film.

Next, a method of manufacturing the semiconductor device according to a second embodiment will be described. The method of manufacturing the semiconductor device according to the second embodiment is a method of manufacturing an IGBT to which the method of manufacturing the semiconductor device according to the first embodiment is applied. A structure of the semiconductor device fabricated (manufactured) by the method of manufacturing the semiconductor device according to the second embodiment is depicted in FIG. 11. FIG. 11 is a cross-sectional view of an example of the semiconductor device fabricated (manufactured) by the method of manufacturing the semiconductor device according to the second embodiment. The semiconductor device according to the second embodiment and depicted in FIG. 11 is a trench gate IGBT that has the n-type FS region 5.

In particular, as depicted in FIG. 11, in the active region 11, a p-type base region 31 is provided in the surface layer at the front surface of the $n^-$-type semiconductor substrate 10 constituting the $n^-$-type drift region 1. A portion of the semiconductor substrate 10 other than the p-type base region 31 and a $p^+$-type collector region 38 described hereinafter is the $n^-$-type drift region 1. In the $n^-$-type drift region 1, similarly to the first embodiment, the n-type FS region 5 (5a to 5d) is provided spanning the active region 11 and the edge termination region 12. The n-type FS region 5 is disposed near the $p^+$-type collector region 38. The n-type FS region 5 may be in contact with the $p^+$-type collector region 38.

In the p-type base region 31, an $n^+$-type emitter region 32 and a $p^+$-type collector region 33 are each selectively provided. Trenches 34 penetrate the $n^+$-type emitter regions 32 and the p-type base region 31 in a depth direction from the front surface of the semiconductor substrate 10, and reach the $n^-$-type drift region 1. The p-type base region 31 is separated into plural regions (mesa portions) by the trenches 34. One unit cell of the IGBT is constituted by a portion sandwiched between centers of adjacent mesa portions. In each of the mesa portions, the $n^+$-type emitter region 32 and the $p^+$-type collector region 33 are provided.

In each of the trenches 34, a gate electrode 36 is provided via a gate insulating film 35. The $n^+$-type emitter region 32 opposes the gate electrode 36, across the gate insulating film 35 at a side wall of the trench 34. The $p^+$-type collector region 33 is disposed closer to a center portion of the mesa portion than is the $n^+$-type emitter region 32 and is in contact with the $n^+$-type emitter region 32. The p-type base region 31, the $n^+$-type emitter region 32, the $p^+$-type collector region 33, the trench 34, the gate insulating film 35, and the gate electrode 36 constitute a MOS gate 30 having a trench gate structure.

On the front surface of the semiconductor substrate 10, an interlayer insulating film 6' is provided so as to cover the gate electrodes 36. Further, the interlayer insulating film 6', similarly to the first embodiment, covers the front surface of the semiconductor substrate 10 in the edge termination region 12. In the interlayer insulating film 6', contact holes 6a' are provided. In the contact holes 6a', the front surface of the semiconductor substrate 10 (i.e., the $n^+$-type emitter regions 32 and the $p^+$-type collector regions 33) in the mesa portions is exposed. A front electrode 37 is provided so as to be embedded in each of the contact holes 6a' and is in contact with the n$^+$-type emitter regions 32 and the p$^+$-type collector regions 33.

The front electrode 37 is electrically connected to the n$^+$-type emitter regions 32 and the p$^+$-type collector regions 33. The front electrode 37 is electrically insulated from the gate electrodes 36 by the interlayer insulating film 6' and functions as an emitter electrode. The front electrode 37 may extend onto the interlayer insulating film 6' in the edge termination region 12. In the surface layer of the rear surface 10a of the semiconductor substrate 10, the p$^+$-type collector region 38 is provided spanning the active region 11 and the edge termination region 12. A rear electrode 39 is in contact with the p$^+$-type collector region 38 and is electrically connected to the p$^+$-type collector region 38.

A method of manufacturing the semiconductor device according to the second embodiment further includes in the described method of manufacturing the semiconductor device according to the first embodiment (refer to FIGS. 2A and 2B), omitting the processes at steps S11, and S17 to S19. Here, at step S1, the MOS gate 30 is formed with respect to the front surface side of the semiconductor substrate 10 by a general method. At step S9, a p-type impurity is ion-implanted in the surface layer of the rear surface 10a of the semiconductor substrate 10, whereby the p$^+$-type collector region 38 is formed. Further, in the laser annealing at step S13, only the p$^+$-type collector region 38 is activated.

As described above, according to the second embodiment, even when an IGBT is fabricated, the resist protective film is baked before the laser annealing, whereby effects similar to those of the first embodiment may be obtained.

A method of manufacturing the semiconductor device according to a third embodiment will be described. The method of manufacturing the semiconductor device according to the third embodiment is a method of manufacturing a reverse conducting-IGBT (RC-IGBT) to which the methods of manufacturing the semiconductor device according to the first and the second embodiments are applied. A structure of the semiconductor device fabricated (manufactured) by the method of manufacturing the semiconductor device according to the third embodiment is depicted in FIG. 12. FIG. 12 is a cross-sectional view of an example of the semiconductor device manufactured by the method of manufacturing the semiconductor device according to the third embodiment. The semiconductor device according to the third embodiment and depicted in FIG. 12 is a trench gate RC-IGBT that has the n-type FS region 5.

In particular, as depicted in FIG. 1, in the active region 11, on the n$^-$-type semiconductor substrate 10 constituting the n$^-$-type drift region 1, an IGBT portion 41 in which an IGBT is disposed and a FWD portion 42 in which a FWD is disposed are provided. The FWD of the FWD portion 42 is connected in antiparallel to the IGBT of the IGBT portion 41. More specifically, in the IGBT portion 41, similarly to the second embodiment, the MOS gate 30, the interlayer insulating film 6', and the front electrode 37 are provided with respect to the front surface side of the semiconductor substrate 10. With respect to the rear surface side of the semiconductor substrate 10, similarly to the second embodiment, the n-type FS regions 5 (5a to 5d), the p$^+$-type collector region 38, and the rear electrode 39 are provided.

In the FWD portion 42, with respect to the front surface side of the semiconductor substrate 10, similarly to the IGBT portion 41, the p-type base region 31, the trench 34, the gate insulating film 35, the gate electrode 36, the interlayer insulating film 6', and the front electrode 37 are provided. The p-type base region 31 and the front electrode 37 extend across the IGBT portion 41 and the FWD portion 42. The p-type base region 31 and the front electrode 37 serve as the p-type anode region and the anode electrode, respectively, in the FWD portion 42. Each of the trenches 34, in the active region 11 overall, for example, as viewed from the front surface of the semiconductor substrate 10, is disposed in a striped layout that extends along a direction orthogonal to a direction along which the IGBT portion 41 and the FWD portion 42 disposed.

Further, in the FWD portion 42, with respect to the rear surface side of the semiconductor substrate 10, similarly to the first embodiment, the n-type FS regions 5 (5a to 5d), the n$^+$-type cathode region 3', and the rear electrode 39 are provided. The n$^+$-type cathode region 3' is disposed parallel to the p$^+$-type collector region 38 and is in contact with the p$^+$-type collector region 38. The n-type FS regions 5 and the rear electrode 39 extend spanning the IGBT portion 41 and the FWD portion 42. The rear electrode 39 serves as the cathode electrode in the FWD portion 42. In the FWD portion 42, the n$^+$-type emitter region 32 and the p$^+$-type collector region 33 are not provided. In FIG. 12, while the polyimide protective film of the front surface of the semiconductor substrate 10 is not depicted, the polyimide protective film, similarly to the first embodiment, is provided.

In the portion 1a' of a collector/cathode side of the n$^-$-type drift region 1, crystal defects may be introduced by helium implantation, spanning the IGBT portion 41 and the FWD portion 42. In a portion 1b of an emitter/anode side of the n$^-$-type drift region 1, crystal defects may be introduced by helium implantation, spanning the IGBT portion 41 and the FWD portion 42. In FIG. 12, the portion 1a' in which crystal defects are introduced by helium implantation on the collector/cathode side of the n$^-$-type drift region 1, and the portion 1b in which crystal defects are introduced by helium implantation on the emitter/anode side of the n$^-$-type drift region 1 are indicated by lighter hatching than that of the n-type FS regions 5.

A method of manufacturing the semiconductor device according to the third embodiment further includes in the described method of manufacturing the semiconductor device according to the first embodiment (refer to FIGS. 2A and 2B), omitting the processes at steps S11, S18, and S19. Here, at step S1, with respect to the front surface side of the semiconductor substrate 10, similarly to the second embodiment, the MOS gate 30 of the IGBT portion 41 is formed, the p-type base region 31, the trench 34, the gate insulating film 35 and the gate electrode 36 of the FWD portion 42 are formed. At step S9, in the surface layer of the rear surface 10a of the semiconductor substrate 10, similarly to the second embodiment, the p$^+$-type collector region 38 of the IGBT portion 41 is formed and, similarly to the first embodiment, the n$^+$-type cathode region 3' of the FWD portion 42 is formed. Subsequently, in the laser annealing at step S13, only the p$^+$-type collector region 38 and the n$^+$-type cathode region 3' are activated. Further, at step S17, crystal defects are introduced by helium implantation in the portion 1a' of the collector/cathode side of the n$^-$-type drift region 1, and the portion 1b of the emitter/anode side of the n$^-$-type drift region 1.

As described above, according to the third embodiment, even when a RC-IGBT is fabricated, before the laser annealing, the resist protective film is baked, whereby effects similar to those of the first and the second embodiments may be obtained.

Effects obtained from baking (hereinafter, prebaking, step S12 in FIG. 2B) the resist protective film 22 before the laser annealing (step S13 in FIG. 2B) were verified. FIGS. 13 and 14 are tables depicting effects obtained by prebaking the resist protective film by methods of manufacturing the semiconductor device according a first example and a second example. FWDs (hereinafter, the first and the second examples) in the n⁻-type semiconductor substrate (semiconductor wafer) 10 were manufactured according to the described methods of manufacturing the semiconductor devices according to the embodiments (refer to FIGS. 2A and 2B). Samples of the first and the second examples were fabricated by changing the product thickness (thickness after the rear surface grinding) t of the semiconductor substrate 10.

In the first example, the thickness of the resist protective film 22 was 3 μm. The prebaking of the resist protective film 22 was performed at a temperature of 150 degrees C. for 30 minutes. In the laser annealing of the rear surface 10a of the semiconductor substrate 10, a YLF laser was used as the laser 25; the energy density was 1.8 J/cm²; the half-width of the pulse width was 200 ns; the delay time of 2 irradiations was 300 ns; the frequency was 1 kHz; and the laser 25 was irradiated at an overlap rate of 50% both longitudinally and laterally. When the overlap rate was 50% both longitudinally and laterally, the laser 25 was irradiated 2 times both longitudinally and laterally (4 times in total) in each of the segments of the grid into which the rear surface 10a of the semiconductor substrate 10 was divided.

In the second example, the thickness of the resist protective film 22 and the conditions of the prebaking of the resist protective film 22 were similar to those of the first example. Conditions of the laser annealing of the rear surface 10a of the semiconductor substrate 10 were similar to those of the first example with the exception of the half-width of the pulse width of the laser 25 being 200 ns; the delay time of 2 irradiations being 500 ns; and the overlap rate being 66% both longitudinally and laterally. When the overlap rate was 66% both longitudinally and laterally, the laser 25 was irradiated 3 times both longitudinally and laterally (9 times in total) in each of the segments of the grid into which the rear surface 10a of the semiconductor substrate 10 was divided.

In the first and the second examples, whether deterioration, peeling, and/or deformation of the resist protective film 22 occurred with the laser annealing is depicted in FIGS. 13 and 14 (indicated as "prebaking" in FIGS. 13 and 14). For comparison, whether deterioration, peeling, and/or deformation of the resist protective film occurred in the case of a FWD fabricated according the method of manufacturing the conventional semiconductor device (refer to FIG. 15) is also depicted in FIGS. 13 and 14 (hereinafter, first conventional example and second conventional example). In the first and the second conventional examples, FWDs were fabricated under conditions similar to those of the first and the second examples with the exception of no prebaking of the resist protective film was performed (indicated as "no prebaking" in FIGS. 13 and 14).

As depicted in FIG. 13, in the first example, it was confirmed that when the product thickness t of the semiconductor substrate 10 is 50 μm or greater, no deterioration, peeling, or deformation of the resist protective film 22 occurred (○). In contrast, in the first conventional example, it was confirmed that when the product thickness t of the semiconductor substrate was less than 70 μm, deterioration, peeling, and deformation of the resist protective film occurred (x). While not depicted, it was confirmed that when the product thickness t of the semiconductor substrate exceeded 70 μm, in both the first example and the first conventional example, deterioration, peeling, and deformation of the resist protective film did not occur.

Further, as depicted in FIG. 14, in the second example, it was confirmed that when the product thickness t of the semiconductor substrate 10 was 70 μm or greater, no deterioration, peeling, or deformation of the resist protective film 22 occurred (○). In contrast, in the second conventional example, it was confirmed that when the product thickness t of the semiconductor substrate was less than 90 μm, deterioration, peeling, and deformation of the resist protective film occurred (x). While not depicted, it was confirmed that when the product thickness t of the semiconductor substrate exceeded 90 μm, in both the second example and the second conventional example, deterioration, peeling, and deformation of the resist protective film did not occur.

In other words, from the results depicted in FIGS. 13 and 14, it was found that in both the first and the second examples, the prebaking of the resist protective film 22 enables the product thickness t of the semiconductor substrate 10 to be about 20 μm thinner than that in the first and the second conventional examples. In this manner, it was confirmed that by variously changing the conditions of the prebaking of the resist protective film 22 and the conditions of the laser annealing, the lower limit of the product thickness t of the semiconductor substrate 10 by which the resist protective film 22 is not adversely affected by the laser annealing differs, and in the method of manufacturing the semiconductor device according to the described embodiments, the product thickness t of the semiconductor substrate 10 may be thinner as compared to in the method of manufacturing the conventional semiconductor device where conditions other than not performing prebaking are similar to those of the described embodiments.

Further, when the product thickness t of the semiconductor substrate 10 of the first example was less than 50 μm and when the product thickness t of the semiconductor substrate 10 of the second example was less than 70 μm, while deterioration, peeling, and deformation of the resist protective film 22 occurred (x), results for the first and the second examples are results obtained by performing the baking and the laser annealing of the resist protective film 22 under the described various conditions. In actuality, by changing the thickness of the resist protective film 22, the heat-resistant temperature, and conditions of laser annealing, it is possible to make the product thickness t of the semiconductor substrate 10 thinner than the results obtained for the first and the second examples.

While not depicted, the inventor confirmed that even when the methods of manufacturing the semiconductor device according to the second and the third embodiments are used, results similar to those of the first and the second examples described are obtained.

The present invention is not limited to the embodiments described and various modifications within a range not departing from the spirit of the invention are possible. For example, in the embodiments described above, while a case in which a FWD, an IGBT, and a RC-IGBT are fabricated (manufactured) is described as examples, without limitation hereto, while the front surface of the semiconductor wafer is protected by the resist protective film, impurity activation by the laser annealing performed with respect to a diffusion region formed in the surface layer at the rear surface of the semiconductor wafer is applicable to various devices.

The present invention is further applicable in a case in which impurity activation by the laser annealing is performed with respect to a diffusion region formed in the surface layer at the front surface of the semiconductor wafer, while the rear surface of the semiconductor wafer is protected by the resist protective film. Further, in the present invention, silicon (Si) or a semiconductor material (for example, silicon carbide (SiC), gallium nitride (GaN), etc.) having a bandgap that is wider than that of silicon may be used as a semiconductor material. Further, the present invention is similarly implemented when the conductivity types (n-type, p-type) are reversed.

According to the described embodiments of the invention, even when the resist protective film of the front surface of the semiconductor substrate is heated during laser annealing of the rear surface of a semiconductor substrate, substantially no water that may boil due to this heat is present in the resist protective film. Therefore, during the laser annealing of the rear surface of the semiconductor substrate, deterioration of the resist protective film and mixing of air bubbles in the resist protective film may be suppressed.

The method of manufacturing the semiconductor device according to the described embodiments of the invention achieves an effect in that during the heat treatment for impurity activation applied to one main surface of the semiconductor wafer, deterioration, peeling and deformation of the resist protective film that protects the other main side of the semiconductor wafer may be suppressed.

As described, the method of manufacturing the semiconductor device according to the present invention is useful for semiconductor devices having a thin product thickness for the semiconductor substrate and is particularly suitable for semiconductor devices having a product thickness of less than 100 µm for the semiconductor substrate.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A method of manufacturing a semiconductor device, the method comprising:
    (a) forming an element structure at a front surface of a semiconductor substrate;
    (b) forming a resist protective film for protecting the element structure on the front surface of the semiconductor substrate;
    (c) forming a diffusion region at a rear surface of the semiconductor substrate by introducing an impurity from the rear surface of the semiconductor substrate;
    (d) annealing the resist protective film at a temperature of at least 100 degrees C. as a baking process, thereby evaporating water in the resist protective film;
    (e) after the step (d), irradiating the rear surface of the semiconductor substrate with a laser to heat a rear surface side of the semiconductor substrate, thereby activating the impurity; and
    (f) removing the resist protective film.

2. The method according to claim 1, wherein the step (d) is performed after the step (c).

3. The method according to claim 1, wherein in the step (d), the temperature of the annealing is less than a heat-resistant temperature of the resist protective film.

4. The method according to claim 3, wherein in the step (d), the temperature of the annealing is at most 200 degrees C.

5. The method according to claim 1, further comprising
    (g) grinding the semiconductor substrate from the rear surface, thereby reducing a thickness of the semiconductor substrate, after the step (b) and before the step (c), wherein
    in the step (c), the impurity is introduced from the rear surface that is ground in the step (g).

6. The method according to claim 1, wherein the step (b) includes:
    forming the resist protective film by applying a resist to the front surface of the semiconductor substrate; and
    annealing the resist protective film as a prebaking process, thereby evaporating a solvent in the resist protective film.

7. The method according to claim 6, wherein
    in the step (d), the annealing of the resist protective film to evaporate the water is performed under conditions identical to conditions in the prebaking process in the step (b).

8. The method according to claim 5, wherein
    the step (g) includes:
    affixing a protective tape to an entire upper surface of the resist protective film, and
    planarizing the protective tape.

9. The method according to claim 8, wherein the protective tape affixed and planarized in the step (g) is removed before the step (d) is performed.

* * * * *